United States Patent
Hwang et al.

(10) Patent No.: US 9,332,665 B2
(45) Date of Patent: May 3, 2016

(54) DISPLAY APPARATUS

(71) Applicant: LG DISPLAY CO., LTD., Seoul (KR)

(72) Inventors: Hak Mo Hwang, Goyang-si (KR); In Jue Kim, Paju-si (KR); Yong Joong Yoon, Paju-si (KR); Sung Hwan Yoon, Goyang-si (KR); In-Han Ga, Anseong-si (KR)

(73) Assignee: LG Display Co., Ltd., Seoul (KR)

( * ) Notice: Subject to any disclaimer, the term of this patent is extended or adjusted under 35 U.S.C. 154(b) by 32 days.

(21) Appl. No.: 14/304,575

(22) Filed: Jun. 13, 2014

(65) Prior Publication Data

US 2014/0293574 A1    Oct. 2, 2014

Related U.S. Application Data

(63) Continuation of application No. 13/295,222, filed on Nov. 14, 2011, now Pat. No. 8,792,252.

(30) Foreign Application Priority Data

May 2, 2011 (KR) .................. 10-2011-0041296

(51) Int. Cl.
    *H05K 7/00* (2006.01)
    *H05K 7/02* (2006.01)
    *G02F 1/1333* (2006.01)
    *G02B 5/30* (2006.01)
    *G02B 27/26* (2006.01)
    *H05K 5/00* (2006.01)
    *H04N 13/04* (2006.01)

(52) U.S. Cl.
CPC ............... *H05K 7/02* (2013.01); *G02B 5/3083* (2013.01); *G02B 27/26* (2013.01); *G02F 1/133308* (2013.01); *H05K 5/0017* (2013.01); *G02F 2001/13332* (2013.01); *G02F 2001/133311* (2013.01); *G02F 2001/133317* (2013.01); *G02F 2001/133331* (2013.01); *G02F 2201/503* (2013.01); *G02F 2413/01* (2013.01); *H04N 13/0434* (2013.01); *H04N 13/0452* (2013.01); *H04N 2213/001* (2013.01)

(58) Field of Classification Search
None
See application file for complete search history.

(56) References Cited

U.S. PATENT DOCUMENTS 5,610,742 A    3/1997   Hinata et al.
5,687,465 A * 11/1997   Hinata .................. G02F 1/1333
                                                                                            156/286
6,204,906 B1    3/2001   Tannas (Continued)

FOREIGN PATENT DOCUMENTS

EP        052632 A1   3/1993
JP        5027247 A   2/1993

(Continued)

OTHER PUBLICATIONS

Akata et al. (JP2006-215488) English translation.*

(Continued)

*Primary Examiner* — Steven T Sawyer
(74) *Attorney, Agent, or Firm* — Morgan, Lewis & Bockius LLP

(57) ABSTRACT

A display apparatus includes a display panel including lower and upper substrates confronting each other, and a film member combined with the upper substrate; and a panel support member to support the display panel to expose the front and lateral sides of the display panel to the outside.

22 Claims, 10 Drawing Sheets

(56) References Cited

U.S. PATENT DOCUMENTS

| | | |
|---|---|---|
| 6,611,302 B1 | 8/2003 | Ueda et al. |
| 2002/0067591 A1 | 6/2002 | Tajima |
| 2002/0085280 A1 | 7/2002 | Jung |
| 2004/0141102 A1 | 7/2004 | Lin |
| 2007/0222384 A1 | 9/2007 | Yonemoto |
| 2009/0185100 A1* | 7/2009 | Matsuhira ............ G02B 6/005 349/58 |
| 2010/0214521 A1 | 8/2010 | Togashi et al. |
| 2010/0315570 A1 | 12/2010 | Mathew et al. |
| 2012/0206680 A1* | 8/2012 | Onishi ............ G02F 1/134336 349/122 |

FOREIGN PATENT DOCUMENTS

| | | |
|---|---|---|
| JP | 6075209 A1 | 3/1994 |
| JP | H06-250163 | 9/1994 |
| JP | 2006215488 A | 8/2006 |

OTHER PUBLICATIONS

Search Report from the European Patent Office dated Jan. 4, 2012 in European counterpart application.

\* cited by examiner

DISPLAY APPARATUS

CROSS REFERENCE TO RELATED APPLICATIONS

This application is a continuation of U.S. patent application Ser. No. 13/295,222 filed on Nov. 14, 2011, and also claims the benefit of the Korean Patent Application No. 10-2011-0041296 filed on May 2, 2011, both of which are hereby incorporated by reference as if fully set forth herein.

BACKGROUND OF THE INVENTION

1. Field of the Invention

The present invention relates to a display apparatus, and more particularly, to a display apparatus that minimizes thickness while enhancing a sense of beauty through an innovative design.

2. Discussion of the Related Art

Recently, various flat-type display devices have been actively researched and studied as substitutes for cathode ray tube (CRT) displays. The most widely considered devices include liquid crystal display (LCD) devices, plasma display panel (PDP), field emission display (FED) devices, and light emitting display (LED) devices. The LCD device has attracted especially great attention due to its advantageous properties, such as mass production technology, simple driving means, and high picture quality.

Recent research and development are particularly being required on designs of products appealing to consumers. Consequently, efforts for minimizing the thicknesses (slimness) of LCD devices are continuously being made, and research is being conducted on a design with an enhanced sense of beauty that can induce consumers to purchase by appealing to consumers' sense of beauty.

In efforts to minimize the thicknesses of LCD devices and design development to enhance a sense of beauty that have been made to date, the existing elements have been applied as is, the structure of the elements has been minimally changed, and therefore, there are limitations in minimizing the thicknesses of the LCD devices and developing new designs of the LCD devices.

For example, a related art LCD device necessarily uses lower and upper cases to receive a liquid crystal display panel and a backlight unit therein. In addition, front and rear set covers are additionally used in the related art LCD device to manufacture products, such as a notebook computers, monitors, mobile devices, or televisions. As the lower and upper cases and the front and rear set covers for the manufactured device are inevitably used, it makes a limitation in the slimness of the display device and the advance toward the new design. Especially, the front edge parts of the liquid crystal display panel are covered with the upper case and the front set cover so that the liquid crystal display device is increased in its thickness. Also, the edge width of the liquid crystal display device may be increased so that the difference in height of the stepped portion may cause limitations in advance toward the innovative design.

SUMMARY OF THE INVENTION

Accordingly, the present invention is directed to a display apparatus that substantially obviates one or more problems due to limitations and disadvantages of the related art.

An aspect of the present invention is to provide a display apparatus that minimizes thickness and enhances a sense of beauty in design by removing some of case and set covers.

Another object of the present invention is to provide a display apparatus that prevents a film member combined with an upper substrate of a display panel exposed to the outside for the minimum thickness and enhanced sense of beauty in design from being peeled off, and protects a lateral side of the display panel exposed to the outside from an external force.

Another object of the present invention is to provide a display apparatus that prevents light leakage in a lateral side of a display panel exposed to the outside for the minimum thickness and enhanced sense of beauty in design.

Additional features and advantages of the invention will be set forth in the description which follows, and in part will become apparent from the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a display apparatus includes a display panel including lower and upper substrates confronting each other, and a film member combined with the upper substrate; and a panel support member to support the display panel to expose the front and lateral sides of the display panel to the outside.

In another aspect, a display apparatus includes a display panel including lower and upper substrates confronting each other, and a film member combined with a front surface of the upper substrate; a panel protection member formed at an edge portion of the display panel; and a panel support member to support the display panel so as to expose a front side of the display panel to the outside.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts. Hereinafter, a display apparatus according to the present invention will be described with reference to the accompanying drawings.

Figure 1:
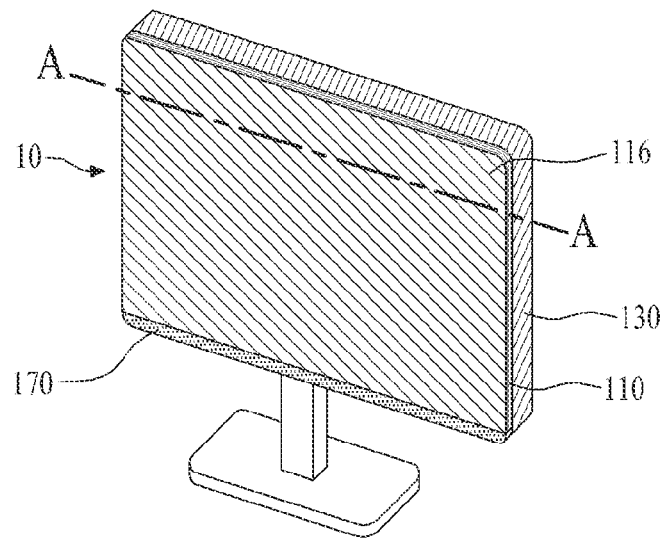
FIG. 1 illustrates a display apparatus according to a first exemplary embodiment according to the present invention.
Figure 2:
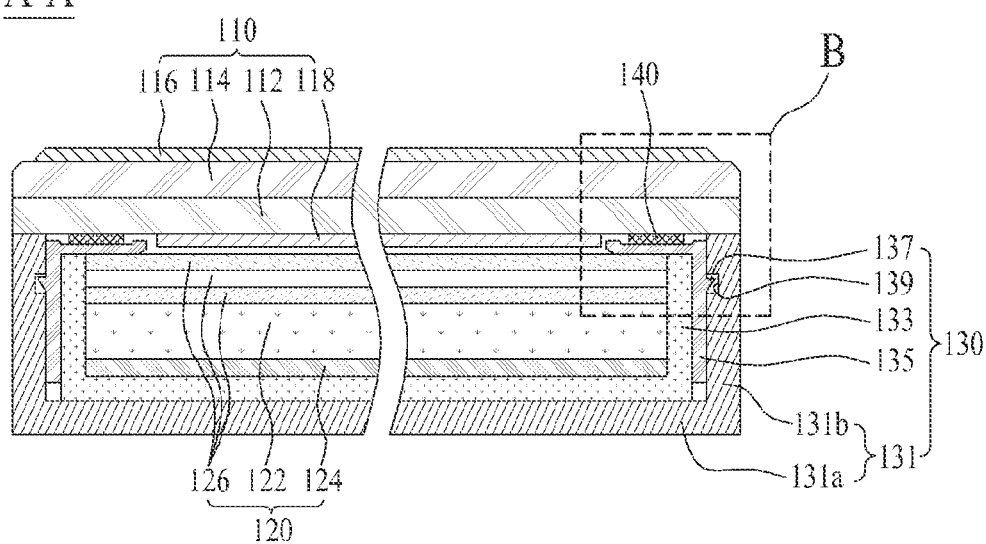
FIG. 2 is a cross sectional view along line A-A of FIG. 1.

FIG. 1 illustrates a display apparatus according to a first exemplary embodiment of the present invention; FIG. 2 is a cross sectional view along line A-A of FIG. 1; and FIG. 3 is an expanded view showing portion 'B' of FIG. 2.

Figure 3:
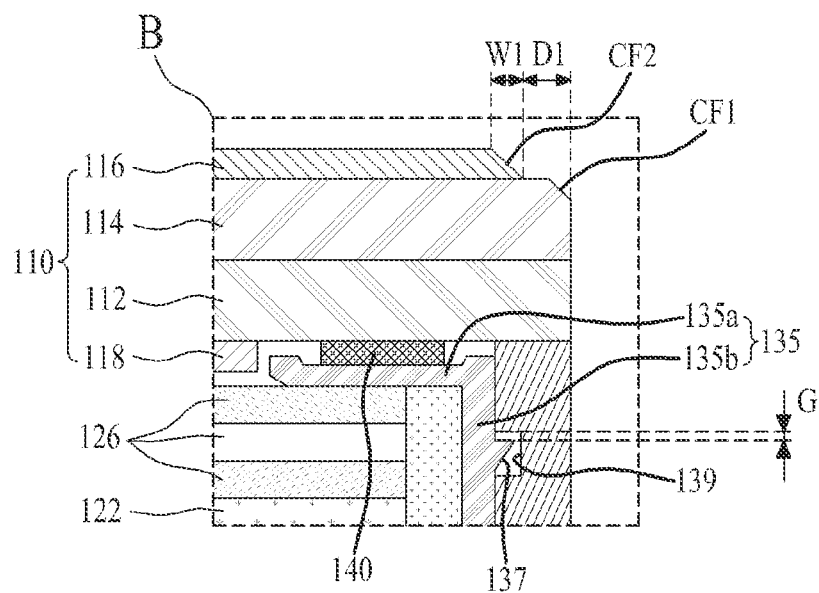
FIG. 3 is an expanded view showing portion 'B' of FIG. 2.

With reference to FIGS. 1 to 3, the display apparatus 10 includes a display panel 110 which includes a lower substrate 112, an upper substrate 114 confronting the lower substrate 112, and a film member 116 combined with the upper substrate 114; a backlight unit 120 which emits light toward the display panel 110; a panel support member 130 which receives the backlight unit 120, and supports the display panel 110 to expose the front and lateral sides of the display panel 110 to the outside; and an adhesive member 140 which connects the display panel 110 and the panel support member 130 with each other. The display panel 110 includes the lower substrate 112; the upper substrate 114 which confronts the lower substrate 112 with a liquid crystal layer (not shown) interposed therebetween; the film member 116 which is combined with and formed on a front surface of the upper substrate 114; and a lower polarizing film 118 which is combined with and formed on a rear surface of the lower substrate 112.

The lower substrate 112 includes a plurality of gate lines (not shown), a plurality of data lines (not shown), and a plurality of pixels (not shown) which are respectively formed at crossing portions of the gate and data lines. Each pixel includes a thin film transistor (not shown) which is connected with the gate and data lines; a pixel electrode which is connected with the thin film transistor; and a common electrode which is formed adjacent to the pixel electrode and is supplied with a common voltage. Depending on a driving method of the liquid crystal layer, the common electrode may be formed on the upper substrate 114. The lower substrate 112 controls light transmittance of the liquid crystal layer by forming an electric field corresponding to a differential voltage between the common voltage and data voltage applied to each pixel.

Under the circumstance that the lower and upper substrates 112 and 114 confronts each other, the upper substrate 114 including color filters respectively provided corresponding to the pixels of the lower substrate 112 is bonded to the lower substrate 112 while being provided with the liquid crystal layer being interposed therebetween. Depending on the driving method of the liquid crystal layer, the common electrode to be supplied with the common voltage may be formed on the upper substrate 114. The upper substrate 114 filters the light incident via the liquid crystal layer by the use of color filters, and emits the color-filtered light so that colored images are displayed on the display panel 110.

A detailed structure of the lower substrate 112 and upper substrate 114 may vary according to a driving mode of the liquid crystal layer, for example, twisted nematic (TN) mode, vertical alignment (VA) mode, in-plane switching (IPS) mode, and fringe field switching (FFS) mode. The film member 116 is combined with (or attached to) the front surface of the upper substrate 114, wherein the film member 116 includes an upper polarizing film for polarizing the light emitted to the outside via the upper substrate 114.

The lower polarizing film 118 is attached to the rear surface of the lower substrate 112. The lower polarizing film 118 polarizes the light emitted from the backlight unit 120 to the display panel 110.

The display panel 110 is supported by the panel support member 130 so that the front and lateral sides of the display panel 110 are exposed to the outside. Here, the front and lateral sides of the display panel 110 are exposed to the outside so that a structure (bezel) forming the front edge part of the display panel 110 can be removed, and a stepped portion of the edge part can also be removed, thereby enhancing a sense of beauty in the design of external appearance. In this case, since the lateral side of the display panel 110 is exposed to the outside, the film member 116 attached to the upper substrate 114 might be peeled off by a user's contact. To overcome this problem, as shown in FIG. 3, the upper side portions of the upper substrate 114 and each side portion of the film member 116 are formed to have inclines (CF1, CF2) with a predetermined gradient.

The upper side portion of the upper substrate 114 is manufactured to have the first incline (CF1) with a first gradient by a process, such as a chamfer. Each side portion of the film member 116 is manufactured to have the second incline (CF2) with a second gradient corresponding to the first gradient by a cutting process using a laser or cutting wheel. In this case, each side portion of the film member 116 is provided with a distance (D1) of 0.1±0.07 mm from the side portion of the upper substrate 114, preferably. Preferably, a width (W1) of the second inclination (CF2) is about 0.15±0.05 mm. Accordingly, the display apparatus 10 includes the first inclination (CF1) formed at the upper side portion of the upper substrate 114, and the second inclination (CF2) formed on each side portion the film member 116, so that the film member can be prevented 116 from being peeled off by the user's contact when the lateral side of the display panel 110 are exposed to the outside.

Figure 4:
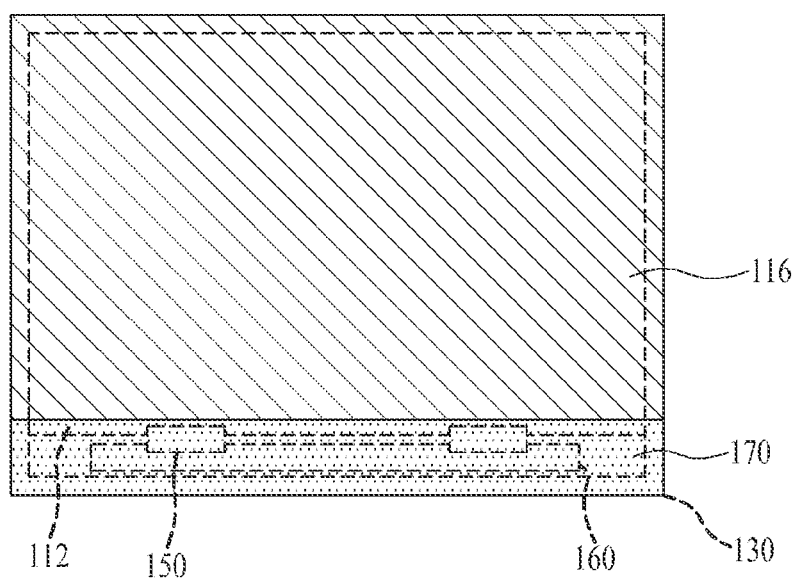
FIG. 4 is a plane view illustrating a display panel of FIG. 1.

As shown in FIG. 4, the display apparatus 10 according to the first exemplary embodiment further includes a plurality of circuit films 150 which are combined with a pad provided in the periphery of the lower substrate 112 corresponding to the first side of the display panel 110; a printed circuit board 160 which is combined with the plurality of circuit films 150; and a deco cover 170 which is combined with the panel support member 130 to cover the pad, the plurality of circuit films 150, and the printed circuit board 160. At this time, the first side of the display panel 110 may be the first longitudinal side between the first and second longitudinal sides of the lower substrate 112.

A data driving integrated circuit (not shown) for supplying a data signal to the display panel 110 is mounted on each of the plurality of circuit films 150. On the lower substrate 112 of the display panel 110, a gate driving circuit (not shown) for supplying a gate (or scan) signal to the display panel 110 is formed by a process for forming the thin film transistor. The plurality of circuit films 150 are attached to the pad of the display panel 100 and the printed circuit board 160 by a tape automated bonding (TAB) process, wherein the plurality of circuit films 150 may be a tape carrier package (TCP) or a chip on flexible board (or chip on film; COF). Accordingly, the display panel 110 is electrically connected with the printed circuit board 160 via the plurality of circuit films 150. The printed circuit board 160 supplies various signals for displaying images on the display panel 110 while being electrically connected with the plurality of circuit films 150. On the printed circuit board 160, there are a timing controller (not shown) for controlling the driving of the display panel 110, various power circuits (not shown), and a memory device (not shown) which are mounted thereon.

The deco cover 170 is combined with the panel support member 130 corresponding to the first side of the display panel 110, and covers the pad of the display panel 110, the plurality of circuit films 150, and the printed circuit board 160, thereby preventing the pad of the display panel 110, the plurality of circuit films 150, and the printed circuit board 160 from being exposed to the outside. For this, the deco cover 170 includes hook members (not shown), wherein the hook members are formed at both lateral sides of the deco cover 170, and are combined with the panel support member 130.

As shown in FIG. 2, the backlight unit 120 includes a light-guiding plate 122, a reflective sheet 124 and an optical member 126, which are received in the panel support member 130. The light-guiding plate 122 is plate-shaped (or wedge-shaped) so as to advance the light incident onto an incidence face from a light source (not shown) toward the display panel 110. Here, the light source may include fluorescent lamps or light-emitting diodes. The reflective sheet 124 is arranged on a rear surface of the light-guiding plate 122, wherein the reflective sheet 124 reflects the light incident from the light-guiding plate 122 toward the display panel 110. The optical member 126 is arranged on the light-guiding plate 122, wherein the optical member 126 enhances the luminance properties of light advancing toward the display panel 110 from the light-guiding plate 122. For this, the optical member 126 may include at least one diffusion sheet and prism sheet among a lower diffusion sheet, a lower prism sheet, an upper prism sheet, and an upper diffusion sheet.

As shown in FIGS. 2 and 3, the panel support member 130 supports the display panel 110 so as to expose the front side of the film member 116 and the lateral side of the display panel 110 to the outside. For this, the panel support member 130 includes a set cover 131, a support cover 133, a guide frame 135, and first and second coupling members 137 and 139. The set cover 131 has such U-shaped structure as to secure a space for receiving the support cover 133 and the guide frame 135, and supports the rear margin portion of the display panel 110. The set cover 131 may be formed of plastic or metal. For enhancing the sense of beauty in the manufactured display apparatus, it is preferable that the set cover 131 be formed of a metal. For this, the set cover 131 includes a set plate 131a and a set sidewall 131b.

The set plate 131a being plate-shaped functions as a rear cover of the manufactured display apparatus 10. That is, the set plate 131a may be a rear cover of a display product, such as television or notebook computer. The set sidewall 131b being vertically bent from the end of the set plate 131a prepares a predetermined space, and simultaneously supports the rear margin portion of the display panel 110. At this time, the external lateral surface of the set sidewall 131b exactly meets with the external lateral surface of the display panel 110 along the same vertical line without being stepped. The set sidewall 131a is exposed to the outside while covering the lateral side of the guide frame 135 so that the set sidewall 131a functions as a lateral cover of the manufactured display apparatus 10. That is, the set sidewall 131b may be a lateral cover of a display product, such as a television or notebook computer.

The support cover 133 is received in the predetermined space prepared by the set cover 131, wherein the support cover 133 supports the guide frame 135 and receives the backlight unit 120 therein. For this, the support cover 133 includes a support plate which supports the backlight unit 120, and a support sidewall which is vertically bent from the end of the support plate. At this time, the support cover 133 may be combined with the set cover 131 by a plurality of coupling screws to be coupled to the support plate through the set plate 131a. For realizing a good design that is slim, the support cover 133 may be removed.

The guide frame 135 is formed in a rectangular frame structure to have a ¬|-shaped cross section. The guide frame 135 is placed on the support sidewall of the support cover 133, and is combined with the rear margin portion of the display panel 110 by the use of adhesive member 140. For this, the guide frame 135 includes a panel combining part 135a, and a guide sidewall 135b which is vertically bent from the panel combining part 135a and is combined with the set sidewall 131b.

The panel combining part 135a is formed in a plate shape to face toward the rear margin portion of the display panel 110. At this time, the panel combining part 135a has a groove having a predetermined depth for facilitating to form the adhesive member 140. The guide sidewall 135b being vertically bent from one end of the panel combining part 135a adjacent to the set sidewall 131b is provided in the space between the set sidewall 131b and the support sidewall of the support cover 133, and is simultaneously combined with the set sidewall 131b.

The first coupling member 137 is formed in the guide sidewall 135b of the guide frame 135. The second coupling member 139 is formed in the set sidewall 131b of the set cover 131 while being coupled with the first coupling member 137. For example, the first coupling member 137 protrudes from the outer sidewall of the guide sidewall 135b, wherein the first coupling member 137 includes a stepped surface and an inclined surface. The second coupling member 139 is hollowly formed (or recesses) with a predetermined depth from the inner sidewall of the set sidewall 131b so that the second coupling member 139 is provided corresponding to the first coupling member 137. At this time, the stepped surface of the first coupling member 137 prevents the first coupling member 137 from being detached from the second coupling member 139, and the inclined surface of the first coupling member 137 facilitates the coupling of the first and second coupling members 137 and 139. The first and second coupling members 137 and 139 respectively have the opposite structures to be coupled with each other.

For the above explanation, the guide frame 135 and the set cover 131 are mutually combined with each other, but it is not limited to this structure. In the aspect of the design of the display apparatus 10, the guide frame 135 and the support sidewall of the support cover 133 may be mutually combined with each other. In this case, the set cover 131 may be combined with the support cover 133 by the plurality of coupling screws to be coupled to the cover plate of the support cover 133 through the set plate 131a.

The adhesive member 140 is formed in the panel combining part 135a of the guide frame 135, thereby combining the display panel 110 and the guide frame 135 with each other. Preferably, the adhesive member 140 is combined with the lower substrate 112 of the display panel 110 in consideration to the adhesive strength and thickness, but not necessarily. However, the adhesive member 140 may be combined with the lower polarizing film 118. The adhesive member 140 may be two-sided tape, an adhesive or other suitable means.

In the display apparatus 10 according to the first exemplary embodiment, the display panel 110 is combined with the guide frame 135 by the use of adhesive member 140, and the guide frame 135 with the display panel 110 combined therewith is combined with the set cover 131. Thus, the upper case and front set cover of the related art can be eliminated. However, since the display panel 110 is fixed to the guide frame 135 by the adhesive member 140, light leakage may occur due to the change of liquid crystal layer by the external force applied to the display panel 110 to which the adhesive member 140 is attached, or the change of liquid crystal layer by the adhesive strength of the adhesive member 140. That is, the light leakage may occur because the display panel 110 is not moved. To solve this problem of light leakage, as shown in FIG. 3, the first coupling member 137 and the second coupling member 139 are coupled with a predetermined gap (G) for the movement of the display panel 110. Thus, if the external force is applied to the display panel 110 in the display apparatus 10 according to the first embodiment of the present invention, the first coupling member 137 may be moved within the gap (G) between the first and second coupling members 137 and 139 in at least one direction among the X-axis, Y-axis, and Z-axis directions to adjust for movement or expansion of the display panel 110, thereby preventing the light leakage caused by the display panel 110 being not moved.

Figure 5:
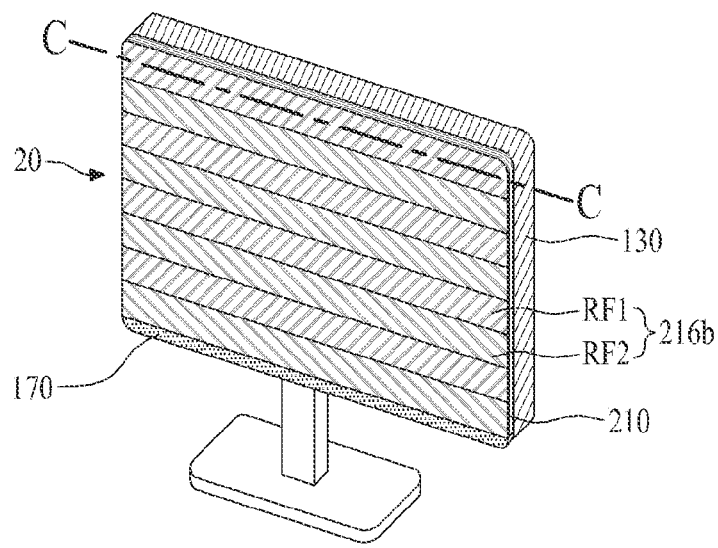
FIG. 5 illustrates a display apparatus according to a second exemplary embodiment according to the present invention.
Figure 6:
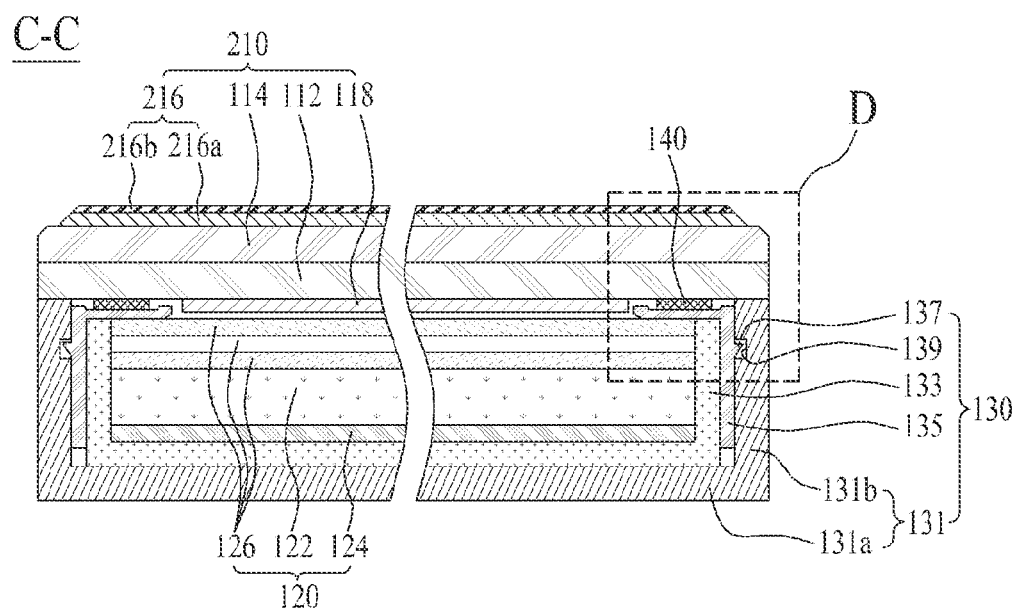
FIG. 6 is a cross sectional view along line C-C of FIG. 5.
Figure 7:
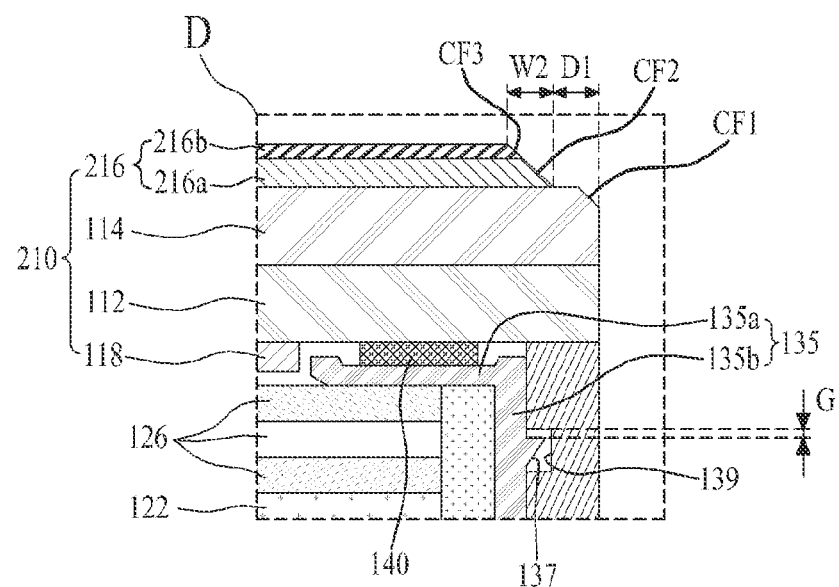
FIG. 7 is an expanded view showing portion 'D' of FIG. 6.

In the display apparatus 10 according to the first exemplary embodiment, the front and lateral sides of the display panel 110 supported by the panel support member 130 are exposed to the outside. As a result, the thickness can be reduced by removing the upper case and front set cover, which have been generally used for the related art display device. Further, the structure (bezel) forming the front edge part of the display panel 110 can be removed, and the stepped part of the edge part can also be removed, thereby resulting in an enhanced sense of beauty in the design of external appearance. Also, the inclines CF1, CF2 are formed on the side portions of the film member 116 and the upper substrate 114 so that it is possible to prevent the film member 116 combined with the display panel 110 to be exposed to the outside from being peeled off FIG. 5 illustrates a display apparatus according to a second exemplary embodiment. FIG. 6 is a cross sectional view along line C-C of FIG. 5. FIG. 7 is an expanded view showing portion 'D' of FIG. 6.

As shown in FIGS. 5 and 6, the display apparatus 20 according to the second embodiment includes a display panel 210 for displaying a stereoscopic image, wherein the display panel 210 includes a lower substrate 112, an upper substrate 114 confronting the lower substrate 112, and a film member 216 combined with the upper substrate 114; a backlight unit 120 which emits light toward the display panel 210; a panel support member 130 which receives the backlight unit 120, and supports the display panel 210 to expose the front and lateral sides of the display panel 210 to the outside; and an adhesive member 140 which connects the display panel 210 and the panel support member 130 with each other.

Except that left and right images are spatially divided by the display panel 210, and are separated by the film member 216, the display apparatus 20 according to the second exemplary embodiment is generally the same in structure to the display apparatus 10 according to the first exemplary embodiment. Thus, a detailed explanation for the other elements except the display panel 210 and the film member 216 will be omitted.

Except that the left image and right image are alternately displayed by unit of a horizontal line corresponding to a gate line or a vertical line corresponding to a data line, the display panel 210 of the display apparatus 20 according to the second exemplary embodiment is generally the same in structure to the display panel 210 of the display apparatus 20 according to the first exemplary embodiment.

The film member 216 includes an upper polarizing film 216a which polarizes the light emitted to the outside via the upper substrate 114; and a retarder film 216b or other functional optical film which is combined with the upper polarizing film 216a, and separates the left image and the right image from each other. The upper polarizing film 216a is combined with a front surface of the upper substrate 114 of the display panel 210 except a deco cover 170. At this time, each side portion of the upper polarizing film 216a has a second inclination (CF2) having a second gradient corresponding to a first gradient of a first incline (CF1) of the upper substrate 114 by a cutting process using a laser or cutting wheel. In this case, each side portion of the upper polarizing film 216a is provided with a distance (D1) of 0.1±0.07 mm from the side portion of the upper substrate 114, preferably. The retarder film 216b is combined with a front surface of the upper polarizing film 216a. At this time, each side portion of the retarder film 216b is manufactured to have a third inclination (CF3) having a third gradient corresponding to the second gradient of the second incline (CF2) of the upper polarizing film 216a by the above cutting process using a laser or cutting wheel. Preferably, an entire width (W2) of the second and third inclinations (CF2, CF3) is about 0.15±0.05 mm.

The above retarder film 216b separates the left image and the right image to be displayed on the display panel 210. For this, the retarder film 216b includes a plurality of first retarder patterns (RF1) which are overlapped with the horizontal or vertical line of the display panel 210 on which the left image is to be displayed; and a plurality of second retarder patterns (RF2) which are respectively formed between each of the plural first retarder patterns (RF1) while being overlapped with the horizontal or vertical line of the display panel 210 on which the right image is to be displayed. The first and second retarder patterns (RF1, RF2) reciprocally changes optical axes of the left image and the right image to be emitted from the display panel 210 to the outside.

Except that the stereoscopic image is displayed on the display panel 210, and the film member 216 includes the retarder film 216b, the display apparatus 20 according to the second exemplary embodiment of the present invention is generally the same in structure to the display apparatus 10 according to the first exemplary embodiment so that the display apparatus 20 according to the second exemplary embodiment can apply the same effects as those of the first exemplary embodiment to a stereoscopic image display apparatus.

Figure 8:
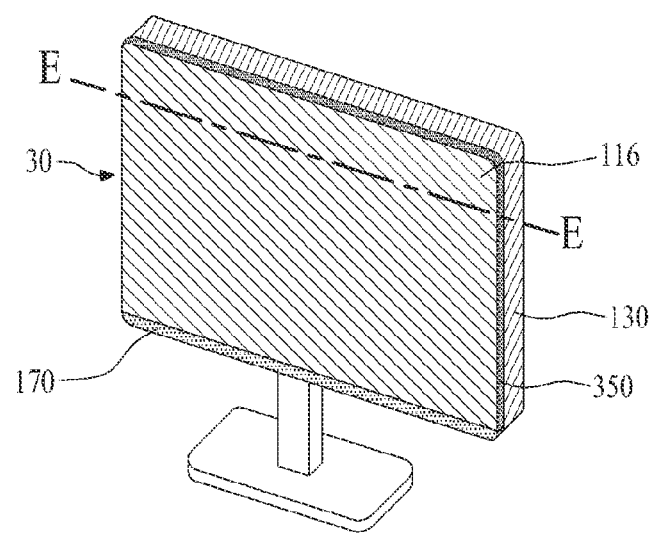
FIG. 8 illustrates a display apparatus according to a third exemplary embodiment according to the present invention.
Figure 9:
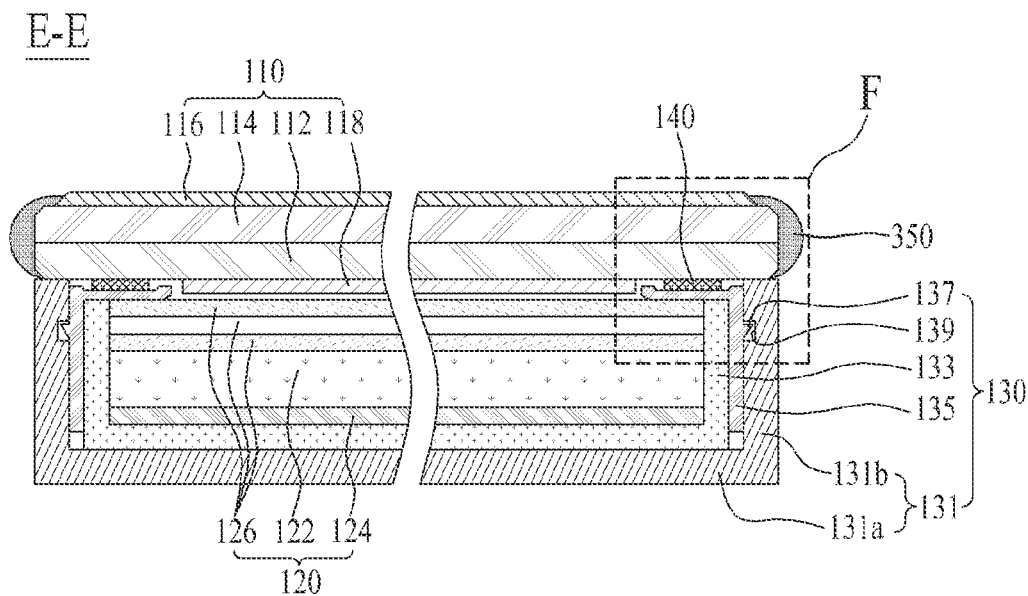
FIG. 9 is a cross sectional view along line E-E of FIG. 8.
Figure 10:
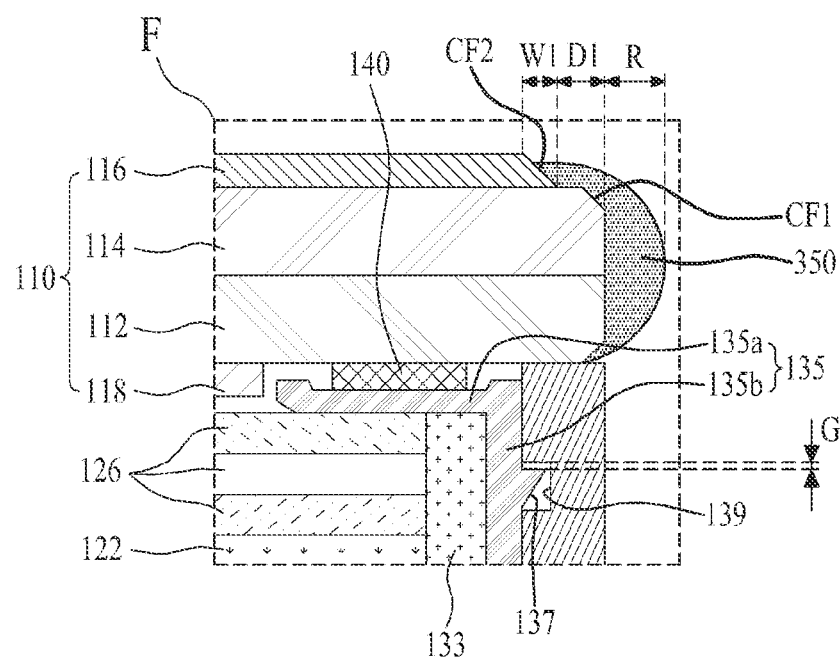
FIG. 10 is an expanded view showing portion 'F' of FIG. 9.

FIG. 8 illustrates a display apparatus according to a third exemplary embodiment of the present invention. FIG. 9 is a cross sectional view along line E-E of FIG. 8. FIG. 10 is an expanded view showing portion 'F' of FIG. 9.

With reference to FIGS. 8 to 10, the display apparatus 30 according to the third exemplary embodiment includes a display panel 110 which includes a lower substrate 112, an upper substrate 114 confronting the lower substrate 112, and a film member 116 combined with the upper substrate 114; a backlight unit 120 which emits light toward the display panel 110; a panel support member 130 which receives the backlight unit 120, and supports the display panel 110 to expose the front and lateral sides of the display panel 110 to the outside; an adhesive member 140 which connects the display panel 110 and the panel support member 130 with each other; and a panel protection member 350 formed on the edge part of the display panel 110 to protect the edge part of the display panel 110.

Except the panel protection member 350 of the display apparatus 30, the display apparatus 30 according to the third exemplary embodiment is generally the same in structure to the display apparatus 10 according to the first exemplary embodiment so that a detailed explanation for other elements except the panel protection member 350 will be omitted, and the same reference numbers will be used throughout the drawings to refer to the same or like parts.

The panel protection member 350 is formed in the edge part of the display panel 110 corresponding to the second, third, and fourth sides except the first side of the display panel 110. As shown in FIG. 4, a plurality of circuit films 150, and a printed circuit board 150 combined with the circuit films 150 are arranged in a pad which is provided in the periphery of the lower substrate 112 corresponding to the first side of the display panel 110. The portion corresponding to the first side of the display panel 110 is covered by a deco cover 170, so it is unnecessary to form the panel protection member 350 at the portion corresponding to the first side. The panel protection member 350 may be formed of silicon-based or UV curable sealant (or resin). In consideration to tack time, a UV curable sealant may be used. In this case, viscosity of the sealant is 1500~30000 cps, but it is not limited to the above range. The viscosity of the sealant may be selected depending on the process time. Also, the panel protection member 350 may be colorless (or transparent) or colored (for example, blue, red, or black), but it is not limited to the above example. The color of the panel protection member 350 may be selected depending on the design of the display apparatus. To prevent the light from leaking in the lateral side of the display panel 110 by the internal total reflection occurring in the lower substrate 112 of the display panel 110, the panel protection member 350 may be formed of colored resin or light-shielding resin.

As shown in FIG. 10, the panel protection member 350 according to a first example is formed on the edge part of the display panel 110 including the entire side portions of the lower and upper substrates 112 and 114, and the partial side portion of the film member 116. At this time, the upper portion of the panel protection member 350 covers the partial side portion of the film member 116, that is, the lower side portion of the second inclination (CF2).

Figure 11:
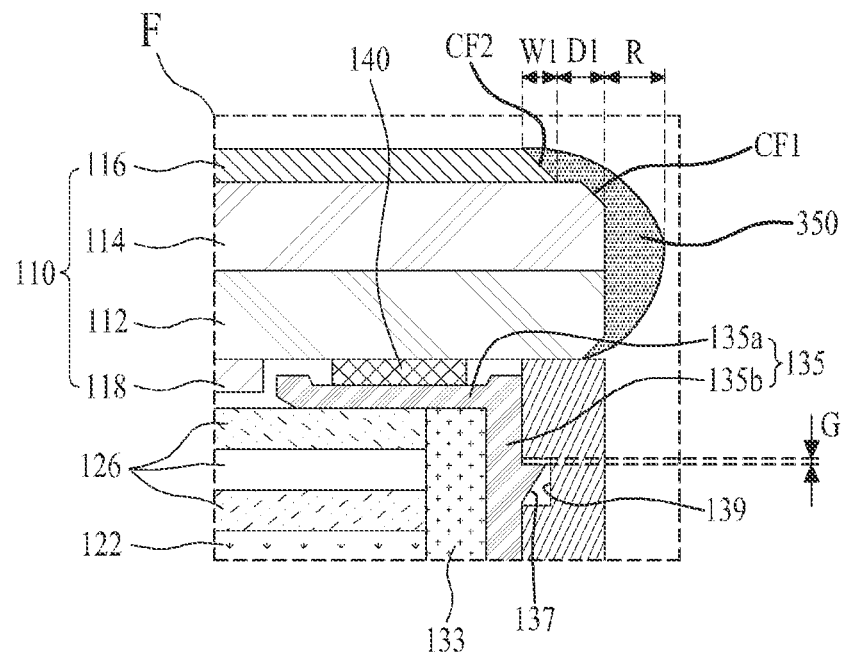
FIG. 11 illustrates another example of a panel protection member of FIG. 9.

As shown in FIG. 11, the panel protection member 350 according to a second example is formed on the edge part of the display panel 110 including the entire side portions of the lower and upper substrates 112 and 114 and the film member 116. At this time, the upper portion of the panel protection member 350 covers the entire side portion of the film member 116, that is, the entire side portion of the second inclination (CF2).

Figure 12:
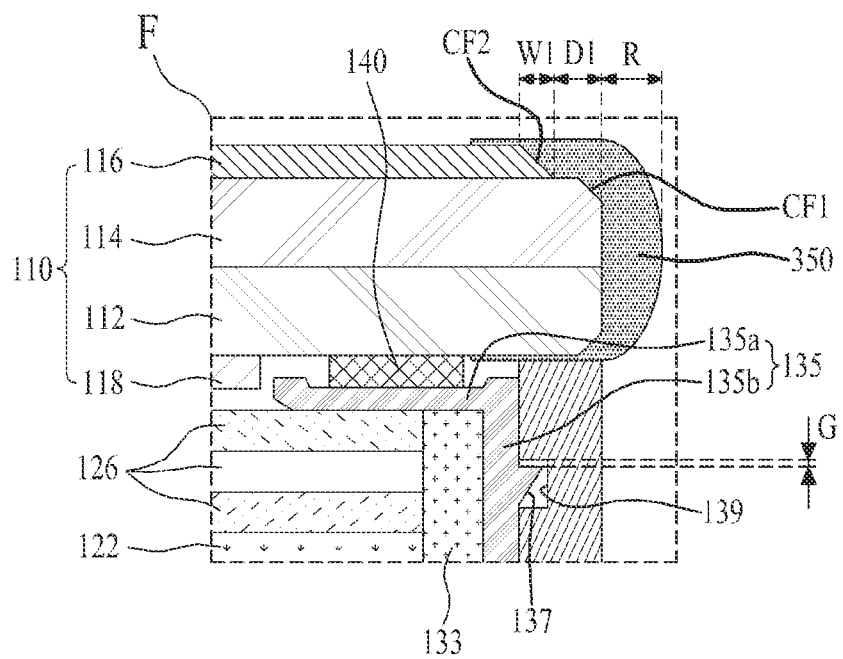
FIG. 12 illustrates another example of a panel protection member of FIG. 9.

As shown in FIG. 12, the panel protection member 350 according to a third example is formed on the edge part of the display panel 110 including the front margin portion of the film member 116, the entire side portion of the film member 116, the entire side portions of the lower and upper substrates 112 and 114, and the rear margin portion of the lower substrate 112.

The above panel protection member 350 according to the first to third examples may have a curvature (R) of 0.2~X from the lateral side of the display panel 110. At this time, the above 'X' may be the mean of the entire thickness of the lower and upper substrates 112 and 114 of the display panel 110, and the film member 116.

As the panel protection member 350 according to the first to third exemplary embodiments is formed in the edge part of the display panel 110, the upper case and front set cover, which have been used for the general display device, are removed from the display apparatus according to the present invention so that it is possible to protect the edge part of the display panel 110 being exposed to the outside from the surroundings or external force. That is, the panel protection member 350 formed in the edge part of the display panel 110 has at least the following advantages: 1) enhancing the endurance of display panel 110 by preventing the display panel 110 exposed to the outside from being damaged by the external force; 2) preventing the film member 116 from being peeled off; 3) preventing a user from being injured when using the display panel 110 exposed to the outside; 4) preventing moisture from being permeated into the inside of the display panel 110; 5) preventing light from leaking in the lateral side by the light total reflection occurring inside the display panel 110. Thus, the display apparatus 30 according to the third exemplary embodiment may provide the same effect as that of the display apparatus 10 according to the first exemplary embodiment, and furthermore, prevents the damage of the display panel 110, the peeling-off of the film member 116, moisture permeation, and the light leakage at the lateral side by the use of panel protection member 350 formed in the edge part of the display panel 110.

Figure 13:
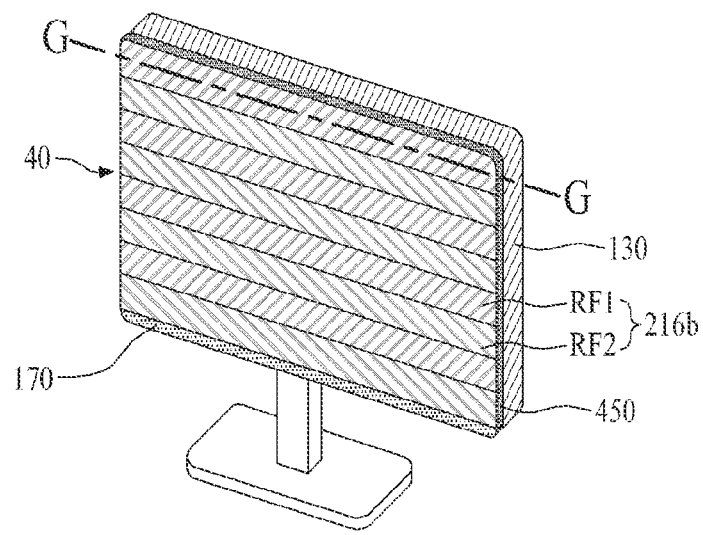
FIG. 13 illustrates a display apparatus according to a fourth exemplary embodiment according to the present invention.
Figure 14:
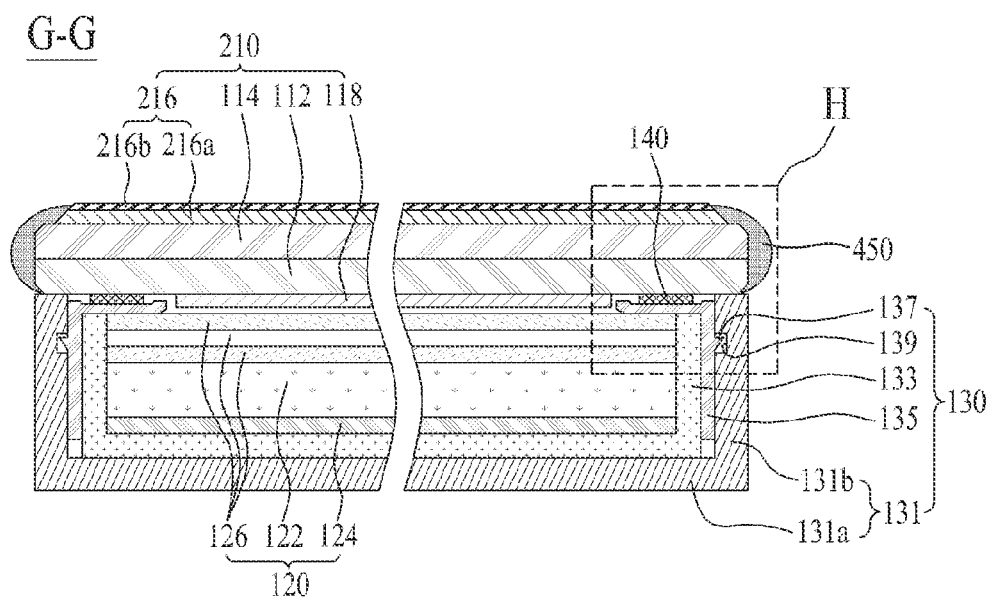
FIG. 14 is a cross sectional view along line G-G of FIG. 13.
Figure 15:
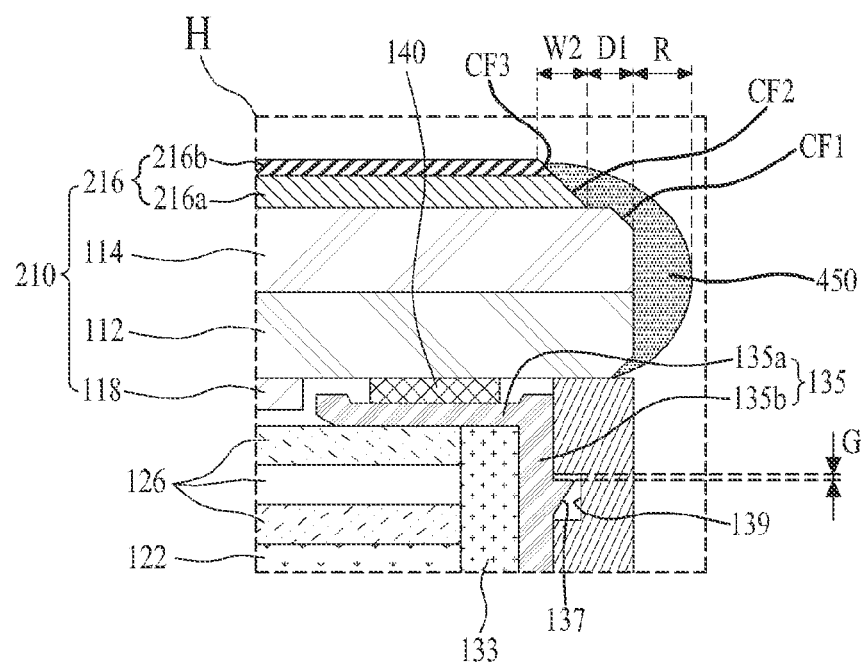
FIG. 15 is an expanded view showing portion 'H' of FIG. 14.

FIG. 13 illustrates a display apparatus according to a fourth exemplary embodiment of the present invention. FIG. 14 is a cross sectional view along line G-G of FIG. 13. FIG. 15 is an expanded view showing portion 'H' of FIG. 14.

With reference to FIGS. 13 to 15, the display apparatus 40 according to the fourth exemplary embodiment includes a display panel 210 for displaying a stereoscopic image, wherein the display panel 210 includes a lower substrate 112, an upper substrate 114 confronting the lower substrate 112, and a film member 216 combined with the upper substrate 114; a backlight unit 120 which emits light toward the display panel 210; a panel support member 130 which receives the backlight unit 120, and supports the display panel 210 to expose the front and lateral sides of the display panel 210 to the outside; an adhesive member 140 which connects the display panel 210 and the panel support member 130 with each other; and a panel protection member 450 which is formed on the edge part of the display panel 210 to protect the edge part of the display panel 110. Except the panel protection member 450 of the display apparatus 40, the display apparatus 40 according to the fourth exemplary embodiment is generally the same in structure to the display apparatus 20 according to the second exemplary embodiment so that a detailed explanation for other elements except the panel protection member 450 will be omitted, and the same reference numbers will be used throughout the drawings to refer to the same or like parts.

The panel protection member 450 is formed in the edge part of the display panel 210 corresponding to the second, third, and fourth sides except the first side of the display panel 210. The panel protection member 450 is formed of the same material as that of the panel protection member 350 of the display apparatus 30 according to the third exemplary embodiment.

As shown in FIG. 15, the panel protection member 450 is formed in the edge part of the display panel 210 including the entire side portion of the lower substrate 112, the entire side portion of the upper substrate 114, the entire side portion of the upper polarizing film 216*a*, and the partial side portion of the retarder film 216*b*. At this time, the upper portion of the panel protection member 450 covers the partial side portion of the retarder film 216*b*, that is, the lower portion of the third inclination (CF3).

In a manner similar to the panel protection member 350 of FIG. 11, although not shown, the panel protection member 450 according to the second exemplary embodiment is formed in the edge part of the display panel 210 including the entire side portion of the lower substrate 112, the entire side portion of the upper substrate 114, the entire side portion of the upper polarizing film 216a, and the entire side portion of the retarder film 216b. At this time, the upper portion of the panel protection member 450 according to the second exemplary embodiment covers the entire side portion of the retarder film 216b, that is, the entire portion of the third inclination (CF3).

In a manner similar to the panel protection member 350 of FIG. 12, although not shown, the panel protection member 450 according to the third exemplary embodiment is formed in the edge part of the display panel 210 including the front margin portion and entire side portion of the retarder film 216b, the entire side portion of the lower substrate 112, the entire side portion of the upper substrate 114, and the rear margin portion of the lower substrate 112.

The above panel protection member 450 according to the first to third exemplary embodiments may have a curvature (R) of 0.2~X from the lateral side of the display panel 210. At this time, the above 'X' may be the mean of the entire thickness of the lower and upper substrates 112 and 114 of the display panel 210, and the film member 216.

As the panel protection member 450 according to the first to third exemplary embodiments is formed in the edge part of the display panel 210, the upper case and front set cover, which have been used for the general display device, are eliminated from the display apparatus so that it is possible to protect the edge part of the display panel 210 being exposed to the outside from the surroundings or external force.

The display apparatus 40 according to the fourth exemplary embodiment may provide the same effect as that of the display apparatus 20 according to the second exemplary embodiment, and furthermore, prevents the damage of the display panel 210, the peeling-off of the film member 216, moisture permeation, and light leakage at the lateral side by the use of panel protection member 450 formed in the edge part of the display panel 210.

Figure 16:
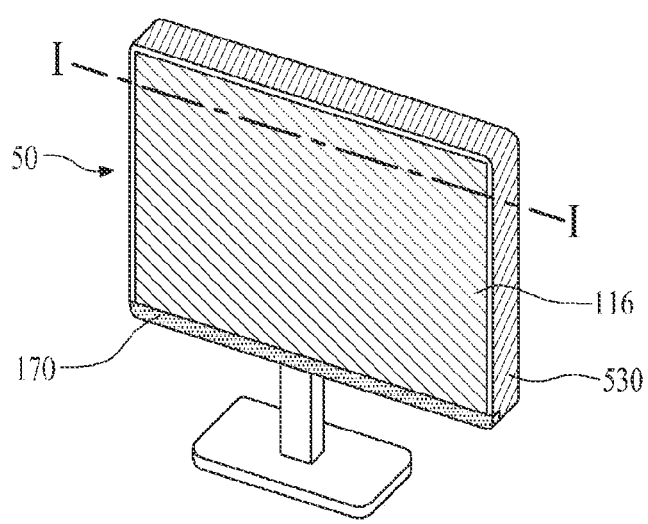
FIG. 16 illustrates a display apparatus according to a fifth exemplary embodiment according to the present invention.
Figure 17:
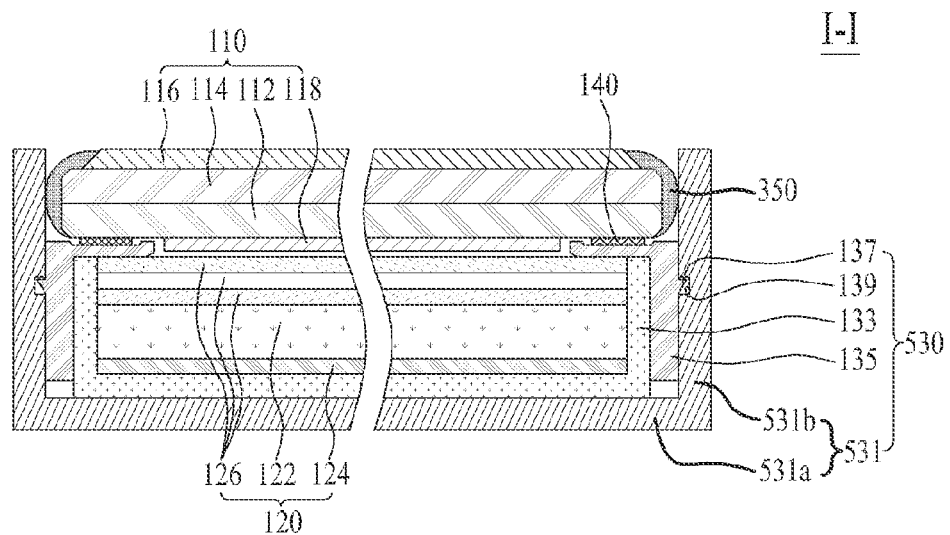
FIG. 17 is a cross sectional view along line I-I of FIG. 16.

FIG. 16 illustrates a display apparatus according to a fifth exemplary embodiment. FIG. 17 is a cross sectional view along line I-I of FIG. 16.

With reference to FIGS. 16 and 17, the display apparatus 50 comprises a display panel 110 which includes a lower substrate 112, an upper substrate 114 confronting the lower substrate 112, and a film member 116 combined with the upper substrate 114; a backlight unit 120 which emits light toward the display panel 110; a panel support member 530 which receives the backlight unit 120, and supports the display panel 110 to expose the front and lateral sides of the display panel 110 to the outside; an adhesive member 140 which connects the display panel 110 and the panel support member 130 with each other; and a panel protection member 350 which is formed on the edge part of the display panel 110 to protect the edge part of the display panel 110.

Except the panel support member 530 of the display apparatus 50, the display apparatus 50 according to the fifth embodiment of the present invention is identical in structure to the display apparatus 30 according to the third embodiment of the present invention, whereby a detailed explanation for the same parts will be omitted, and the same reference numbers will be used throughout the drawings to refer to the same or like parts.

The panel support member 530 supports the display panel 110 to expose only the front side of the film member 116, and simultaneously covers the lateral side of the panel protection member 350 formed in the display panel 110. The panel support member 530 includes a set cover 531, a support cover 133, a guide frame 135, and first and second coupling members 137 and 139. Except the structure of the set cover 531, the panel support member 530 according to the fifth exemplary embodiment is generally the same as the panel support member 130 of the display apparatus 30 according to the third exemplary embodiment. Thus, a detailed explanation for the same parts will be omitted, and the same reference numbers will be used throughout the drawings to refer to the same or like parts.

The set cover 531 has a U-shaped structure to secure a space for receiving the support cover 133 and the guide frame 135, and covers the lateral side of the display panel 110. The set cover 531 may be formed of plastic or metal. To enhance a sense of beauty in the manufactured display apparatus, the set cover 531 is formed of the metal. For this, the set cover 531 includes a set plate 531a and a set sidewall 531b. The set plate 531a being plate-shaped functions as a rear cover of the manufactured display apparatus 50. That is, the set plate 531a may be a rear cover of a display product such as television or notebook computer. The set sidewall 531b being vertically bent from the end of the set plate 531a prepares a predetermined space, and simultaneously covers the lateral side of the panel protection member 350 formed in the edge part of the display panel 110. At this time, a height of the set sidewall 531b is determined such that the top surface of the set sidewall 531b is identical to the top surface of the film member 116 without being stepped. The set sidewall 531b is exposed to the outside so as to cover the lateral side of the display panel 110 so that the set sidewall 531b forms the border (or bezel) of the display panel 110, and simultaneously serves as a lateral cover of the manufactured display apparatus 50. That is, the set sidewall 531b may be a lateral cover of a display product, such as television or notebook computer.

Figure 18:
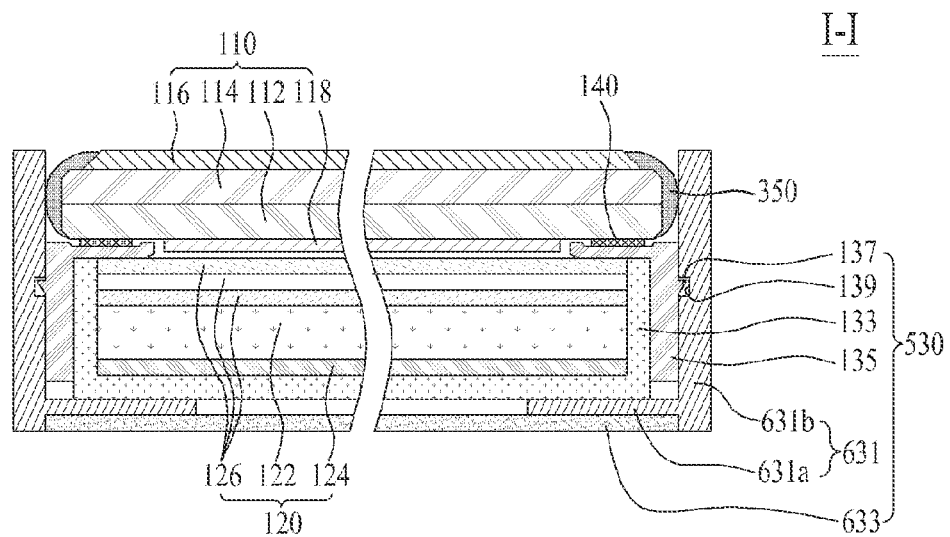
FIG. 18 illustrates another example of a panel support member of FIG. 16.

As shown in FIG. 18, the panel support member 530 according to the second exemplary embodiment includes a set cover 631, a rear cover 633, a support cover 133, a guide frame 135, and first and second coupling members 137 and 139. Except the set cover 631 and the rear cover 633, the panel support member 530 is generally the same as the panel support member 130 of the display apparatus 30 according to the third exemplary embodiment. Thus, a detailed explanation for the same parts will be omitted, and the same reference numbers will be used throughout the drawings to refer to the same or like parts.

The set cover 631 includes a set plate 631a and a set sidewall 631b. The set plate 631a being plate-shaped covers the rear of the display panel 110, that is, the rear peripheral region of the support cover 133 in which the backlight unit 200 is received. The set sidewall 631b being vertically bent from the end of the set plate 631a prepares a predetermined space, and simultaneously covers the panel protection member 350 formed in the edge part of the display panel 110. At this time, a height of the set sidewall 631b is determined in such a manner that the top surface of the set sidewall 631b is identical to the top surface of the film member 116 without being stepped. The set sidewall 631b is exposed to the outside to cover the lateral side of the display panel 110 so that the set sidewall 631b forms the border (or bezel) of the display panel 110, and simultaneously serves as a lateral cover of the manufactured display apparatus 50. That is, the set sidewall 631b may be a lateral cover of a display product such as television or notebook computer. The set cover 631 serves as the rear and lateral covers of the manufactured display apparatus, wherein the set cover 631 may be formed of transparent plastic material, but it is not limited to the above material. In consideration for the design, the set cover 631 may be formed of a gold-colored or silver-colored plastic or a metal.

The rear cover 633 being plate-shaped covers the rear of the set plate 631a so that the rear cover 633 serves as a rear cover of the manufactured display apparatus 50. At this time, the rear cover 633 may be adhered to the rear of the set plate 631a by the use of two-sided tape or adhesive, or may be combined with the rear of the set plate 631a by a plurality of coupling screws (not shown) to be coupled to the set plate 631a or support plate of the support cover 133. The rear cover 633 may be formed of plastic or more preferably, metal.

The display apparatus 50 according to the fifth exemplary embodiment may provide the same effect as that of the display apparatus 30 according to the third exemplary embodiment, and furthermore, stably supports the display panel 110 by covering the lateral side of the display panel 100 through the set sidewall 531b, 631b of the set cover 531, 631. However, as compared with the display apparatus 30 according to the third exemplary embodiment, the display apparatus 50 according to the fifth exemplary embodiment has a border of the display panel 110 due to the set sidewall 531b, 631b, thereby resulting in the lowered sense of beauty in the design of the display apparatus. For mitigate the reduced sense of beauty in the design of the border of the display panel 110, the sidewall 531b, 631b may have a thickness (or width) of 0.3 mm~2 mm.

Like the display panel 210 of the display apparatus 40 according to the fourth exemplary embodiment, the display panel 110 of the display apparatus 50 according to the fifth exemplary embodiment may display the stereoscopic image. In the same manner as the film member 216 of the display apparatus 40 according to the fourth exemplary embodiment, the film member 116 of the display apparatus 50 according to the fifth exemplary embodiment also includes the upper polarizing film 216a and the retarder film 216b.

Figure 19:
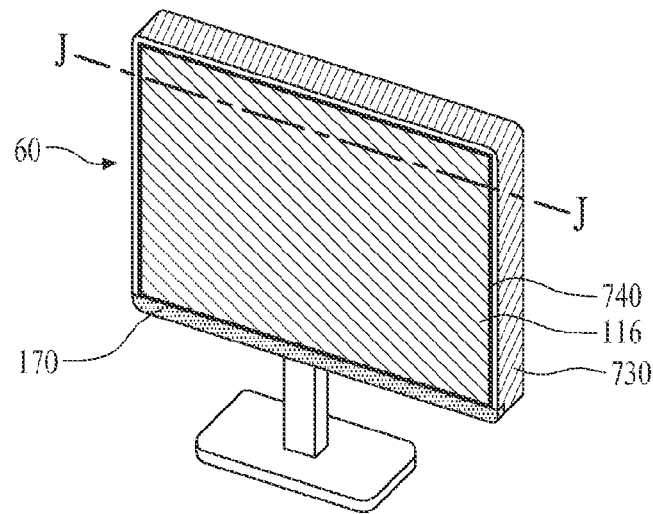
FIG. 19 illustrates a display apparatus according to a sixth exemplary embodiment according to the present invention.
Figure 20:
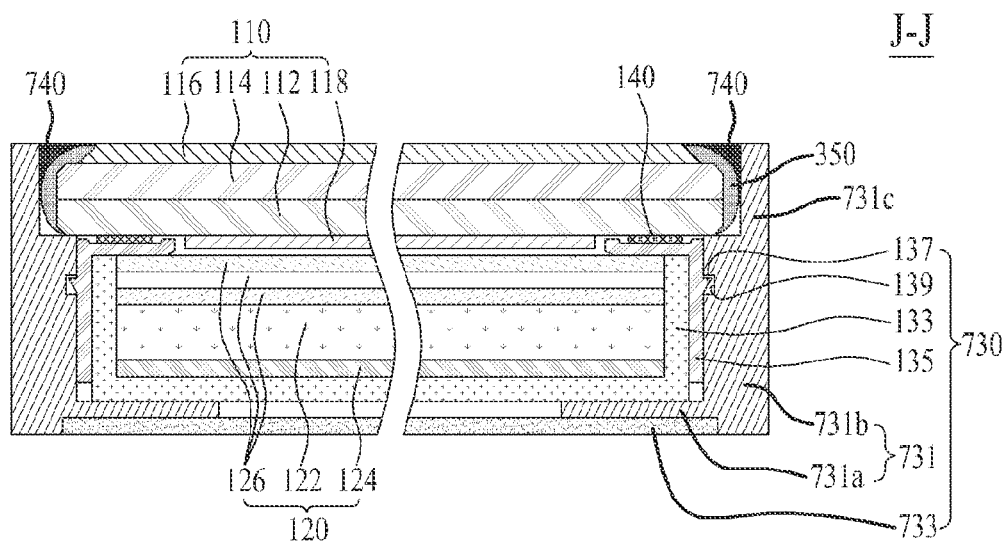
FIG. 20 is a cross sectional view along line J-J of FIG. 19.

FIG. 19 illustrates a display apparatus according to a sixth exemplary embodiment of the present invention. FIG. 20 is a cross sectional view along line J-J of FIG. 19.

With reference to FIGS. 19 and 20, the display apparatus 60 according to the sixth exemplary embodiment comprises a display panel 110 which includes a lower substrate 112, an upper substrate 114 confronting the lower substrate 112, and a film member 116 combined with the upper substrate 114; a backlight unit 120 which emits light toward the display panel 110; a panel support member 730 which receives the backlight unit 120, and supports the display panel 110 to expose the front and lateral sides of the display panel 110 to the outside; an adhesive member 140 which connects the display panel 110 and the panel support member 130 with each other; a panel protection member 350 which is formed on the edge part of the display panel 110 to protect the edge part of the display panel 110; and a sealing member 740 which seals a space between the lateral side of the film member 116 and the panel support member 730 to cover the panel protection member 350. Except the panel support member 730 and the sealing member 740, the display apparatus 60 according to the sixth exemplary embodiment is generally the same in structure to the display apparatus 30 according to the third exemplary embodiment. Thus, a detailed explanation for the same parts will be omitted, and the same reference numbers will be used throughout the drawings to refer to the same or like parts.

The panel support member 730 includes a set cover 731, a rear cover 733, a support cover 133, a guide frame 135, and first and second coupling members 137 and 139. Except the set cover 731 and the rear cover 733, the panel support member 730 is generally the same in structure to the panel support member 130 of the display apparatus 30 according to the third exemplary embodiment. Thus, a detailed explanation for the same parts will be omitted, and the same reference numbers will be used throughout the drawings to refer to the same or like parts.

The set cover 731 includes a set plate 731a, a lower set sidewall 731b, and an upper set sidewall 731c. The set plate 731a being plate-shaped covers the rear of the display panel 110, that is, the rear peripheral region of the support cover 133 in which the backlight unit 200 is received. The lower set sidewall 731b being vertically bent from the end of the set plate 731a prepares a predetermined space; covers the lateral side (the above guide sidewall) of the guide frame 135; and supports the rear peripheral region of the display panel 110. Inside the lower set sidewall 731b, there is the second coupling member 139 to be coupled with the first coupling member 137 formed in the guide frame 135.

The upper set sidewall 731c is vertically extended from the upper surface of the lower set sidewall 731b, and then covers the lateral side of the panel protection member 350 formed in the edge part of the display panel 110. At this time, a height of the upper set sidewall 731c is determined such that the top surface of the upper set sidewall 731b is identical to the top surface of the film member 116 without being stepped. The upper set sidewall 731c is exposed to the outside so as to cover the lateral side of the display panel 110, whereby the upper set sidewall 731c forms the border (or bezel) of the display panel 110. The above lower set sidewall 731b and the upper set sidewall 731c may be a lateral cover of a display product, such as television or notebook computer.

The set cover 731 serves as the rear and lateral covers of the manufactured display apparatus, wherein the set cover 731 may be formed of transparent plastic material, but it is not limited to the above material. In consideration for the design, the set cover 731 may be formed of a gold-colored or silver-colored plastic or a metal.

The rear cover 733 being plate-shaped covers the rear of the set plate 731a, whereby the rear cover 733 serves as a rear cover of the manufactured display apparatus 60. At this time, the rear cover 733 may be adhered to the rear of the set plate 731a by the use of two-sided tape or adhesive, or may be combined with the rear of the set plate 731a by a plurality of coupling screws (not shown) to be coupled to the set plate 731a or support plate of the support cover 733. The rear cover 733 may be formed of plastic or, more preferably, metal.

The sealing member 740 seals the space between the lateral side of the film member 116 and the upper set sidewall 731c to cover the panel protection member 350 formed in the edge part of the display panel 110. The sealing member 740 of thermo-curable resin or photo-curable resin is filled in the space between the lateral side of the film member 116 and the upper set sidewall 731c, and is cured therein so that the space between the lateral side of the film member 116 and the upper set sidewall 731c is sealed by the panel protection member 350. The sealing member 740 prevents the penetration of foreign material into the inside through the space between the lateral side of the film member 116 and the upper set sidewall 731c, and enhances a sense of beauty in the design.

The above sealing member 740 may be identically applied to the display apparatus 50 according to the fifth exemplary embodiment. That is, the above sealing member 740 may be formed in the space between the set sidewall 531b, 631b and the film member 116 in the display apparatus 50 according to the fifth exemplary embodiment so that the space between the set sidewall 531b, 631b and the film member 116 may be sealed by the panel protection member 350.

Like the display apparatus 40 according to the fourth exemplary embodiment, the display panel 110 of the display apparatus 60 according to the sixth embodiment may display the stereoscopic image. In the same manner as the film member 216 of the display apparatus 40 according to the fourth exemplary embodiment, the film member 116 of the display apparatus 60 according to the sixth exemplary embodiment also includes the upper polarizing film 216a and the retarder film 216b.

For the above description, the liquid crystal display product is manufactured by the display apparatus 10, 20, 30, 40, 50, 60 according to the first to sixth exemplary embodiments which include the display panel 110, 210 and the backlight unit 120. However, the display panel 110, 210 of the display apparatus 10, 20, 30, 40, 50, 60 according to the first to sixth exemplary embodiments may be substituted by an organic light emitting display panel including an organic light emitting device. In this case, since the organic light emitting display panel can emit light in itself, it is possible to remove the backlight unit 120 received in the panel support member 130, 530, 730, and furthermore, to remove the support cover 133 of the panel support member 130, 530, 730.

The organic light emitting display panel includes a lower substrate (not shown), an upper substrate (not shown) confronting the lower substrate, and a film member (not shown) combined with the upper substrate. On the lower substrate, there are a plurality of light emitting cells formed every region defined by gate line, data line and power line. Each of the light emitting cells includes at least one switching transistor connected with the gate and data lines; at least one driving transistor connected with the switching transistor and the power line; and a light emitting device which is turned-on to emit light depending on a current controlled by switching the driving transistor.

The upper substrate is bonded to the lower substrate while confronting the lower substrate, to thereby protect the light emitting device formed on the lower substrate. At this time, the light emitting device is removed from the lower substrate. The upper side portion of the upper substrate is manufactured to have a first incline with a first gradient by a process such as chamfer.

The organic light emitting display panel may display only the general two-dimensional image, or may display the two-dimensional image or stereoscopic image depending on an image display mode.

The film member of the display apparatus for displaying only the two-dimensional image on the organic light emitting display panel includes the upper polarizing film which is combined (or adhered to) with the front surface of the upper substrate, wherein the upper polarizing film polarizes the light emitted to the outside via the upper substrate. Each edge of the film member is manufactured to have a second incline with a second gradient corresponding to the first gradient by a cutting process using laser or cutting wheel.

The film member of the display apparatus for displaying the stereoscopic image on the organic light emitting display panel includes an upper polarizing film that polarizes the light emitted to the outside via the upper substrate; and a retarder film combined with the upper polarizing film, the retarder film for dividing an image into a left image and a right image.

Accordingly, the other portions except the front surface of the display panel are covered by the panel support member so that it is possible to remove the upper case and front set cover which have been used for the general display apparatus, thereby resulting in the enhanced sense of beauty by the minimized thickness and the minimized edge width of the display panel.

Only the rear of the display panel is supported by the panel support member so that the front and lateral sides of the display panel are exposed to the outside. Thus, the thickness can be reduced by removing the upper case and front set cover which have been used for the general display apparatus, to remove the structure (bezel) forming the front edge part of the display panel, and to remove stepped portion of the edge part, thereby enhancing the sense of beauty in the design of external appearance.

Also, the inclination are formed in the side portion of the film member combined with the front surface of the upper substrate, thereby preventing the film member combined with the display panel exposed to the outside from being peeled off. In addition, the panel protection member is formed in the edge part of the display panel, thereby preventing the damage of the display panel exposed to the outside, the peeling-off of the film member, the moisture permeation, and the light leakage.

It will be apparent to those skilled in the art that various modifications and variations can be made in the display apparatus without departing from the spirit or scope of the invention. Thus, it is intended that the present invention covers the modifications and variations of this invention provided they come within the scope of the appended claims and their equivalents.

What is claimed is:

1. A display apparatus, comprising:
a display panel including lower and upper substrates confronting each other, and a film member combined with the upper substrate;
a panel support member to support the display panel to expose a front side of the film member to the outside;
an adhesive member combining the display panel and the panel support member with each other; and
a panel protection member attached to an edge part of the display panel;
wherein an upper side portion of the upper substrate has a first incline with a first gradient,
wherein each side portion of the film member has a second incline with a second gradient,
wherein the first and second inclines are laterally offset from each other, and
wherein the panel protection member covers the second incline of the film member, the first incline of the upper substrate, lateral sides of the upper substrate, and lateral sides of the lower substrate so as to expose the front side of the film member to the outside.

2. The display apparatus according to claim 1, wherein the film member includes an upper polarizing film for polarizing the light emitted to the outside via the upper substrate.

3. The display apparatus according to claim 1, wherein the second incline of the film member is provided with a distance of 0.1±0.07 mm from the lateral side of the upper substrate.

4. The display apparatus according to claim 1, wherein the panel protection member is formed a predetermined curvature to cover the first and second inclines, an upper margin portion of the upper substrate corresponding to between the first and second inclines, the lateral sides of the upper substrate, and the lateral sides of the lower substrate.

5. The display apparatus according to claim 4, wherein the panel protection member has a curvature of 0.2 mm~X mm from the lateral side of the display panel, wherein 'X' is the mean of the entire thickness of the lower and upper substrates, and the film member.

6. The display apparatus according to claim 4, wherein the panel protection member is formed from a silicon-based resin or a UV curable resin.

7. The display apparatus according to claim 1, wherein the panel protection member blocks light from leaking into the display panel from a lateral side of the display panel by light total internal reflection.

8. The display apparatus according to claim 7, wherein the panel protection member is formed from a colored resin or a light-shielding resin.

9. The display apparatus according to claim 7, wherein the panel protection member has a black color.

10. The display apparatus according to claim 1, wherein an entire front surface of the display panel is uncovered by the panel support member.

11. The display apparatus according to claim 1, wherein the panel support member includes:
a guide frame adhered to the rear surface of the display panel by the adhesive member; and
a set cover receiving the guide frame, and covering the lateral sides of the guide frame.

12. The display apparatus according to claim 11,
wherein the set cover is attached to a rear surface of the display panel, and
wherein the panel protection member is uncovered by the set cover.

13. The display apparatus according to claim 11, wherein the set cover further covers the lateral sides of the panel protection member.

14. The display apparatus according to claim 13, further comprising a sealing member sealing a space between the lateral side of the film member and a sidewall of the set cover to cover the panel protection member.

15. The display apparatus according to claim 14, wherein the sidewall of the set cover have a thickness or width of 0.3 mm~2 mm.

16. The display apparatus according to claim 1, further comprising a backlight unit disposed at a rear side of the display panel and enclosed by the panel support member.

17. The display apparatus according to claim 1, further comprising:
a plurality of circuit films which is combined with a pad provided in a periphery of the lower substrate corresponding to a first side of the display panel;
a printed circuit board which is combined with the plurality of circuit films; and
a deco cover which is combined with the panel support member to cover the pad, the plurality of circuit films, and the printed circuit board.

18. The display apparatus according to claim 1, wherein the display panel is organic light emitting display panel including a light emitting device which is formed on the lower substrate.

19. A display apparatus, comprising:
a display panel including lower and upper substrates confronting each other, a first film member combined with the upper substrate, and a second film member combined with the first film member;
a panel support member to support the display panel to expose a front side of the second film member to the outside;
an adhesive member combining the display panel and the panel support member with each other; and
a panel protection member attached to an edge part of the display panel;
wherein an upper side portion of the upper substrate has a first incline with a first gradient,
wherein each side portion of the first film member has a second incline with a second gradient,
wherein each side portion of the second film member has a third incline with a third gradient, and
wherein the panel protection member covers the third incline of the film second member, the second incline of the film first member, the first incline of the upper substrate, lateral sides of the upper substrate, and lateral sides of the lower substrate so as to expose the front side of the second film member to the outside.

20. A display apparatus, comprising:
a display panel including lower and upper substrates confronting each other, and a film member combined with the upper substrate;
a panel support member attached to a rear surface of the display panel to support the display panel to expose a front side of the film member to the outside;
an adhesive member combining the display panel and the panel support member with each other; and
a panel protection member attached to an edge part of the display panel;
wherein an upper side portion of the upper substrate has a first incline with a first gradient,
wherein each side portion of the film member has a second incline with a second gradient,
wherein the panel protection member covers the second incline of the film member, the first incline of the upper substrate, lateral sides of the upper substrate, and lateral sides of the lower substrate so as to expose the front side of the film member to the outside, and
wherein the panel protection member is uncovered by the panel support member.

21. A display apparatus, comprising:
a display panel including lower and upper substrates confronting each other, and a film member combined with the upper substrate;
a panel support member to support the display panel to expose a front side of the film member to the outside;
an adhesive member combining the display panel and the panel support member with each other; and
a panel protection member attached to an edge part of the display panel;
wherein an upper side portion of the upper substrate has a first incline with a first gradient,
wherein each side portion of the film member has a second incline with a second gradient,
wherein the panel protection member covers the second incline of the film member, the first incline of the upper substrate, lateral sides of the upper substrate, and lateral sides of the lower substrate so as to expose the front side of the film member to the outside, and
wherein the panel support member covers lateral sides of the panel protection member, and a sealing member is provided to form a seal between the panel support member and the panel protection member.

22. A display apparatus, comprising:
a display panel including lower and upper substrates confronting each other, and a film member combined with the upper substrate;
a panel support member to support the display panel to expose a front side of the film member to the outside;
an adhesive member combining the display panel and the panel support member with each other;
a panel protection member attached to an edge part of the display panel;
a plurality of circuit films which is combined with a pad provided in a periphery of the lower substrate corresponding to a first side of the display panel;
a printed circuit board which is combined with the plurality of circuit films; and a cover which is combined with the panel support member to cover the pad, the plurality of circuit films, and the printed circuit board, wherein an upper side portion of the upper substrate has a first incline with a first gradient, wherein each side portion of the film member has a second incline with a second gradient, and wherein the panel protection member covers the second incline of the film member, the first incline of the upper substrate, lateral sides of the upper substrate, and lateral sides of the lower substrate so as to expose the front side of the film member to the outside.

* * * * *